US008091233B2

(12) United States Patent
Yonemoto et al.

(10) Patent No.: US 8,091,233 B2
(45) Date of Patent: Jan. 10, 2012

(54) METHOD OF MANUFACTURING LIQUID DISCHARGE HEAD

(75) Inventors: Taichi Yonemoto, Isehara (JP); Junichi Kobayashi, Ayase (JP); Yoshinori Tagawa, Yokohama (JP); Hideo Tamura, Kawasaki (JP); Hiroyuki Murayama, Kawasaki (JP); Kenji Fujii, Kawasaki (JP); Keiji Watanabe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 228 days.

(21) Appl. No.: 12/145,428

(22) Filed: Jun. 24, 2008

(65) Prior Publication Data

US 2009/0007428 A1 Jan. 8, 2009

(30) Foreign Application Priority Data

Jul. 2, 2007 (JP) ................................ 2007-174139

(51) Int. Cl.
*B21D 53/76* (2006.01)
*B23P 17/00* (2006.01)
*H01L 41/22* (2006.01)
*H04R 17/00* (2006.01)

(52) U.S. Cl. ...................................... 29/890.1; 29/25.35

(58) Field of Classification Search ................. 29/890.1, 29/25.35; 347/40, 44, 45
See application file for complete search history.

(56) References Cited

U.S. PATENT DOCUMENTS

| | | | | | |
|---|---|---|---|---|---|
| 4,066,491 | A * | 1/1978 | Ruh et al. | ........................ | 216/27 |
| 4,746,935 | A * | 5/1988 | Allen | .............................. | 347/98 |
| 4,812,859 | A * | 3/1989 | Chan et al. | ...................... | 347/63 |
| 5,030,971 | A * | 7/1991 | Drake et al. | .................... | 347/57 |
| 5,208,605 | A * | 5/1993 | Drake | ............................ | 347/15 |
| 5,666,140 | A * | 9/1997 | Mitani et al. | .................... | 347/12 |
| 6,137,502 | A * | 10/2000 | Anderson et al. | ............... | 347/15 |
| 6,146,915 | A * | 11/2000 | Pidwerbecki et al. | .......... | 438/21 |
| 6,267,468 | B1 * | 7/2001 | Torgerson et al. | .............. | 347/43 |
| 6,315,389 | B1 * | 11/2001 | Torgerson et al. | .............. | 347/40 |
| 6,328,405 | B1 * | 12/2001 | Weber et al. | .................... | 347/15 |
| 6,431,682 | B1 * | 8/2002 | Osada et al. | .................... | 347/47 |
| 6,513,896 | B1 * | 2/2003 | Kawamura | ...................... | 347/15 |
| 6,896,357 | B2 * | 5/2005 | Murakami et al. | .............. | 347/43 |
| 6,959,979 | B2 * | 11/2005 | Goin et al. | ...................... | 347/40 |
| 7,198,353 | B2 * | 4/2007 | Hart et al. | ....................... | 347/47 |
| 2002/0039120 | A1 * | 4/2002 | Otsuka et al. | .................. | 347/29 |
| 2004/0227786 | A1 * | 11/2004 | Muraoka | ......................... | 347/40 |

* cited by examiner

*Primary Examiner* — David Angwin
(74) *Attorney, Agent, or Firm* — Canon USA Inc IP Division

(57) ABSTRACT

A method of manufacturing a liquid discharge head including a plurality of passages on a substrate, the passages communicating with a plurality of discharge ports configured to discharge liquid. The method includes the step of forming first, second, third, and fourth members, the first member having a shape of one passage, the second member having a shape of another member, the third member being formed near the first member, the fourth member being formed near the second member, the first to fourth members being formed on a surface of the substrate. The method also includes coating the substrate with a cover layer covering the first to fourth members, removing the first member to form the one passage, and removing the second member to form the another passage.

8 Claims, 5 Drawing Sheets

METHOD OF MANUFACTURING LIQUID DISCHARGE HEAD

BACKGROUND OF THE INVENTION

1. Field of the Invention

The present invention relates to a method of manufacturing a liquid discharge head, and more particularly to a method of manufacturing an inkjet recording head used for an inkjet recording system.

2. Description of the Related Art

For example, a liquid discharge head is applied to an inkjet recording head used for an inkjet recording system. The inkjet recording system only produces almost ignorable, extremely small noise during recording, and it can provide high-speed recording. Also, the inkjet recording system can fix an image on normal paper and perform recording without any special processing. Hence, the inkjet recording system has been popular for several years, and recently, a high-definition and high-quality recording technique is being demanded.

A typical inkjet recording head discharges an ink droplet in a direction perpendicular to a substrate with an ink discharge energy generating element provided thereon. U.S. Pat. No. 7,198,353 discloses such an inkjet recording head, which has a plurality of ink supply ports in a single chip corresponding to a single recording head, and a distance between a discharge port and an energy generating element is varied in accordance with a color of ink within the single chip. In particular, orifice plates with different thicknesses are provided on a common substrate having energy generating elements. However, a method of easily and reproducibly manufacturing an inkjet recording head having orifice plates with different thicknesses on a common substrate is not currently provided.

SUMMARY OF THE INVENTION

The present invention is directed to a method of forming an inkjet recording head.

The present invention easily and reproducibly provides an inkjet recording head having discharge port forming members with different thicknesses on a common substrate having energy generating elements.

Also, the present invention provides an inkjet recording head having discharge port forming members with different thicknesses, which are precisely adjusted, on a common substrate having energy generating elements.

According to an aspect of the present invention, a method of manufacturing a liquid discharge head includes a plurality of passages on a substrate, in which the passages communicate with a plurality of discharge ports configured to discharge liquid. The method includes the steps of: forming first to fourth patterns, the first pattern having a shape of one passage of the passages, the second pattern having a shape of other passage of the passages, the third pattern being formed near the first pattern, the fourth pattern being formed near the second pattern, the first to fourth patterns being formed on the substrate such that longitudinal directions of the first to fourth patterns are arranged substantially in parallel to each other, and that a length of a part of the third pattern differs from a length of a part of the fourth pattern in a direction orthogonal to the longitudinal directions thereof; coating the substrate with a cover layer covering the first to fourth patterns; and removing the first pattern to form the one passage, and removing the second pattern to form the other passage.

Further features of the present invention will become apparent from the following description of exemplary embodiments with reference to the attached drawings.

DESCRIPTION OF THE EMBODIMENTS

Figure 1A:
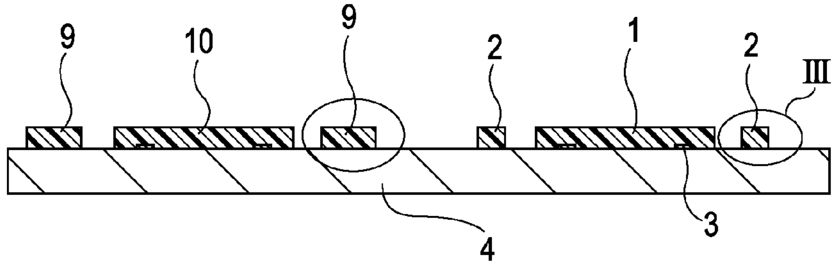
FIGS. 1A to 1D are cross sections showing an example method of manufacturing an inkjet recording head according to an embodiment of the present invention.

Embodiments of the present invention are described below with reference to the attached drawings. In the description, like numerals in the drawings refer to like components having similar functions, and description thereof may be omitted.

In the description, an inkjet recording head is described as an example of a liquid discharge head.

The inkjet recording head can be mounted on a printer, a copier, a facsimile having a communication system, and a device such as a word processor having a printer portion. The inkjet recording head can also be mounted on an industrial recording apparatus in which various processing devices are combined. With the liquid discharge head, recording can be performed on various recording media, such as paper, threads, fiber, textile, leather, metal, plastic, glass, wood, and ceramic. Herein, a term "recording" used in this specification includes not only applying an apparently meaningful image, such as a character or a figure, on a recording medium, but also applying an apparently meaningless image such as a pattern.

In addition, "ink" or "liquid" should be broadly interpreted, which represents a liquid applied on a recording medium for forming an image, a design, or a pattern, processing of a recording medium, or processing of ink or a recording medium. The processing of ink or a recording medium is, for example, to increase a fixing property of ink to be applied on a recording medium through solidification or insolubilization of a coloring material contained in ink, to increase a recording quality or a color development property, or to increase image durability.

Now, exemplary embodiments of the present invention are described with reference to the attached drawings.

Figure 4:
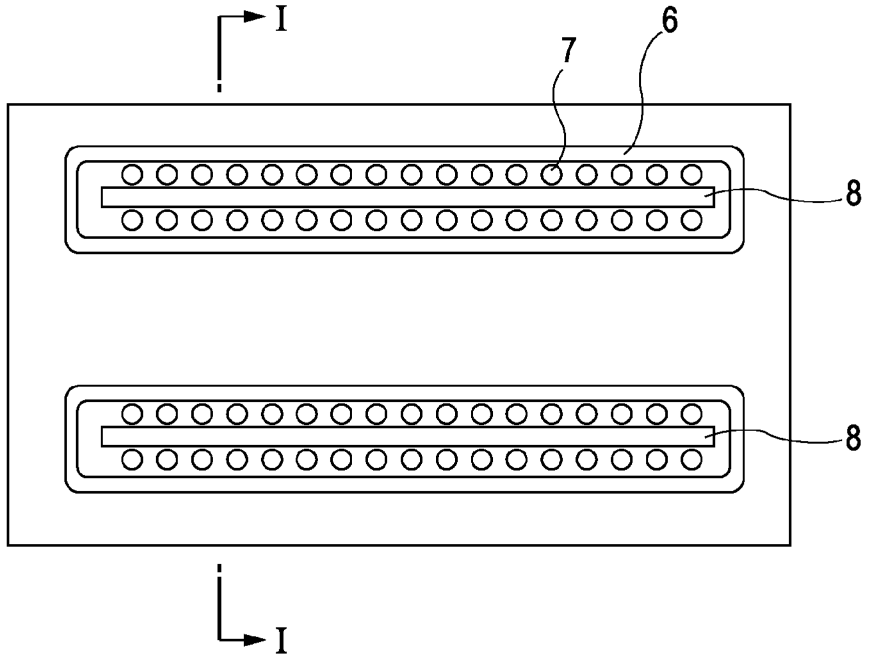
FIG. 4 is a schematic illustration showing the inkjet recording head according to the embodiment of the present invention.
Figure 5:
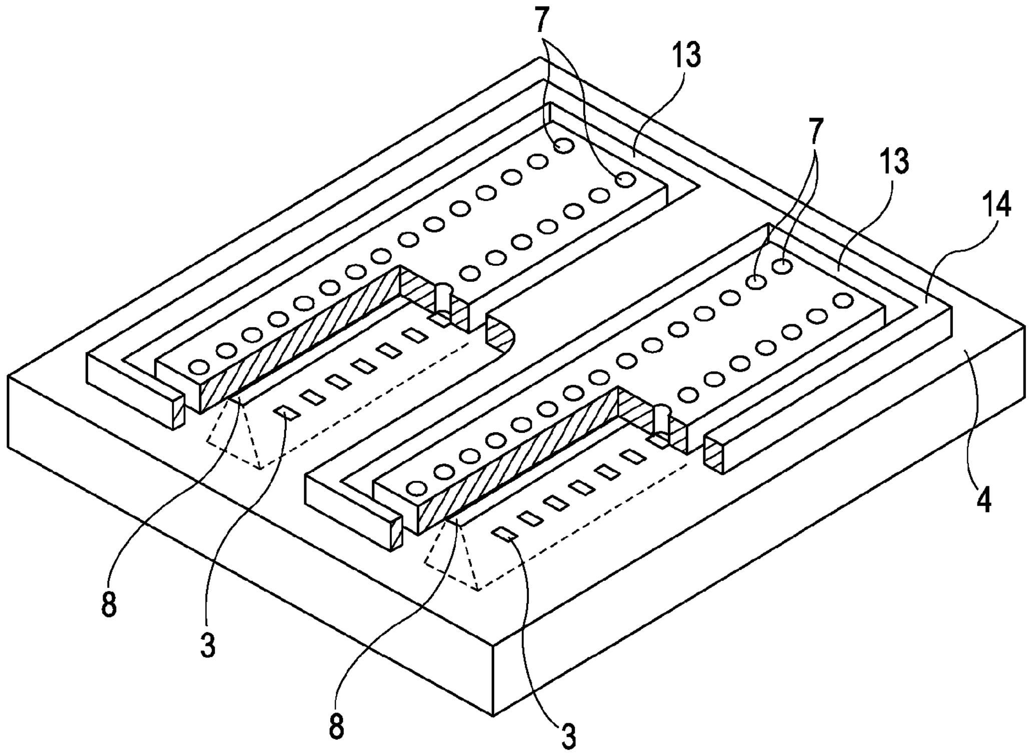
FIG. 5 is a perspective view showing the inkjet recording head according to the embodiment of the present invention.

FIG. 5 is a schematic illustration showing an inkjet recording head (hereinafter, referred to as recording head) according to an exemplary embodiment of the present invention. FIGS. 4 and 5 are views showing an upper side of the recording head. The recording head includes a substrate 4 on which two rows of ink discharge energy generating elements 3 such as heating resistors are arranged at a predetermined pitch. The substrate 4 has an ink supply port 8 between the two rows of the energy generating elements 3. On the substrate 4, a discharge port forming member 14 provides ink discharge ports 7 bored at positions corresponding to the energy generating elements 3, and individual ink passages (liquid passages) which allow the ink discharge ports 7 to communicate with the ink supply port 8. The discharge port forming member 14 is also called an orifice plate. The discharge port forming member 14 also has a groove 13 penetrating from the surface of the discharge port forming member 14 to the substrate 4. The groove 13 surrounds the two rows of ink discharge ports 7.

The inkjet recording head is disposed such that a plane in which the ink discharge ports 7 are formed faces a recording surface of a recording medium, such as paper or a resin sheet. The ink passage is filled with ink (liquid) through the ink supply port 8. Pressure generated in the generating element 3 is applied to the ink. Accordingly, an ink droplet is discharged from the ink discharge port 7, and the ink droplet adheres to the recording medium, for recording. A plurality of ink supply ports 8 are provided to correspond to multiple kinds of liquid to be discharged. A single block of the discharge port forming member 14 includes ink passages and discharge port rows through which the plurality of kinds of liquid flow.

Next, a method of manufacturing a recording head according to an embodiment of the present invention is described.

FIGS. 1A to 1D are schematic cross sections showing an example method of manufacturing the recording head according to the embodiment of the present invention. FIGS. 1A to 1D are views taken along line I-I in FIG. 4.

Referring to FIGS. 1A to 1D, a desired number of energy generating elements 3, such as heating resistors (electrothermal transducers), are provided on the substrate 4 shown in FIGS. 1A to 1D. The energy generating elements 3 generate energy for discharging ink. Then, a first pattern 10 and a second pattern 1 defining the shapes of the ink passages, and third patterns 9 and fourth patterns 2 respectively arranged near the first and second patterns 10 and 1, made of dissoluble resin, are arranged on the substrate 4 having the energy generating elements 3. Herein, the first and third patterns 10 and 9 are spaced apart from each other. Also, the second and fourth patterns 1 and 2 are separately arranged. The first and second patterns 10 and 1 are arranged so as to partially correspond to the generating elements 3.

Figure 7A:
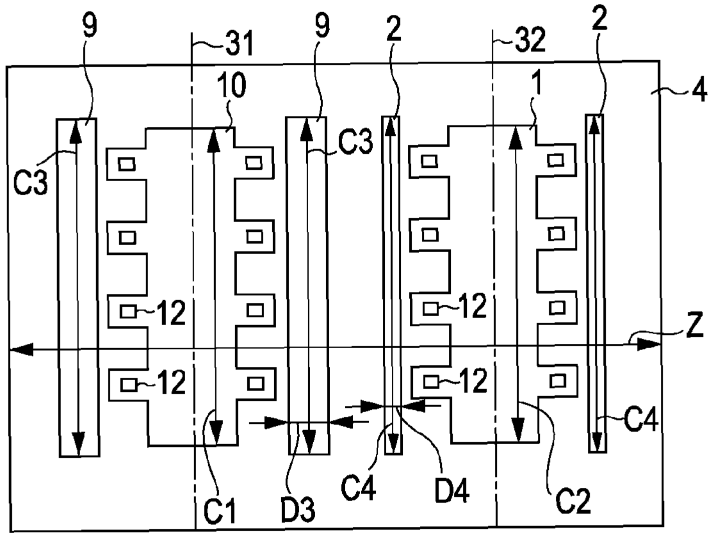
FIGS. 7A to 7C are schematic illustrations showing examples of inkjet recording heads according to the embodiment of the present invention.
Figure 7B:
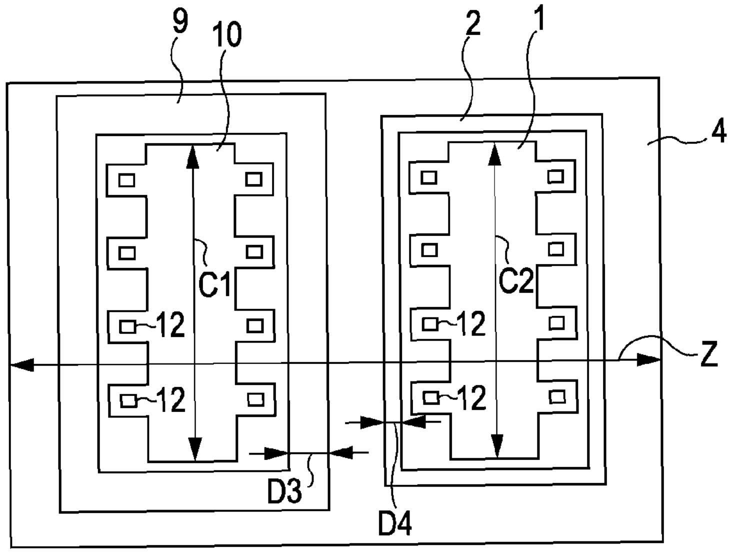
Figure 7C:
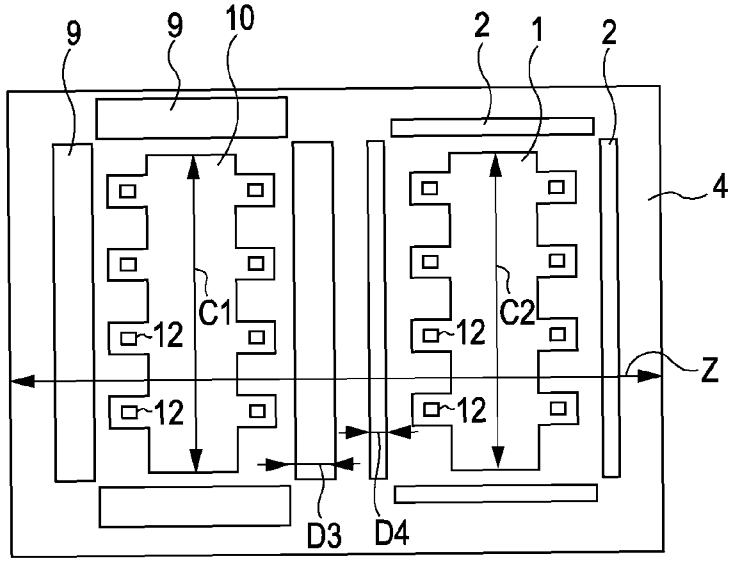

FIGS. 7A to 7C are views showing an upper side of the substrate 4 in the state of FIG. 1A. Referring to FIG. 7A, the first, second, third, and fourth patterns 10, 1, 9, and 2 are arranged so that their longitudinal directions, i.e., C1, C2, C3, and C4 directions are substantially parallel to each other. A Z direction is orthogonal to the C1 to C4 directions. FIGS. 1A to 1D are cross sections taken along the Z direction. Herein, a length D3 of the third patterns 9 in the Z direction is larger than a length D4 of the fourth patterns 2 in the same direction. The lengths D3 and D4 may be predetermined lengths with respect to the C1 direction. The third patterns 9 are arranged to face each other with an axis 31 passing though the center in the Z direction of the first pattern 10 interposed therebetween. Similarly, the fourth patterns 2 are arranged to face each other with an axis 32 passing though the center in the Z direction of the second pattern 1 interposed therebetween. The axes 31 and 32 are also referred to as center axes along the longitudinal directions of the first and second patterns 10 and 1.

Alternatively, referring to FIG. 7B, a third pattern 9 may be arranged to continuously surround the first pattern 10, and a fourth pattern 2 may be arranged to continuously surround the second pattern 1. In this case, lengths D3 and D4 correspond to widths of the third and fourth patterns 9 and 2 with respect to a direction along the first and second patterns 10 and 1. The length D3 is larger than the length D4.

Still alternatively, referring to FIG. 7C, a third pattern 9 may be arranged to discontinuously surround the first pattern 10, and a fourth pattern 2 may be arranged to discontinuously surround the second pattern 1. As illustrated, in the third and fourth patterns 9 and 2, portions along the C1 direction and portions along the Z direction may be separately arranged.

The first and second patterns 10 and 1 may have a substantially equivalent width in the Z direction.

Figure 6:
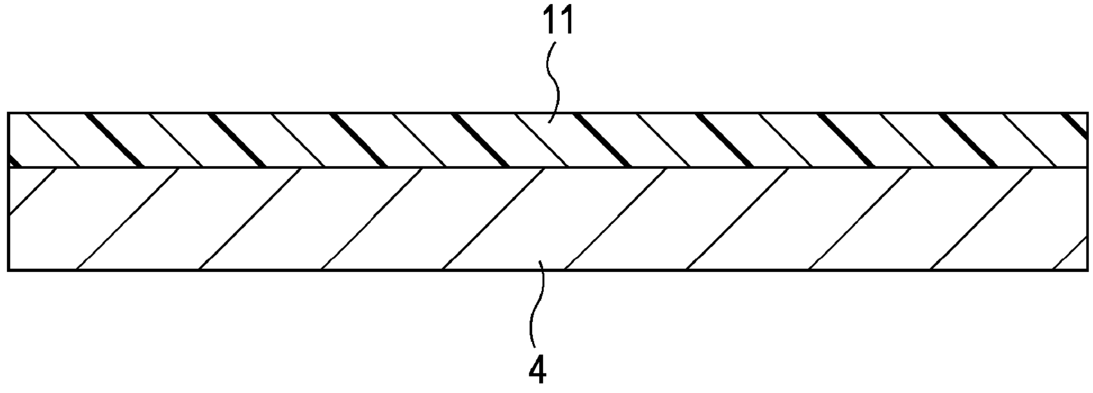
FIG. 6 is a cross section showing a part of the method of manufacturing the inkjet recording head according to the embodiment of the present invention.

The first, second, third, and fourth patterns 10, 1, 9, and 2 may be formed by laminating a positive type photosensitive resin or providing a positive type photosensitive resin by coating such as spin coating; then exposing the applied patterns with UV, or deep UV; and developing the exposed patterns. For example, referring to FIG. 6, a dissoluble positive type photosensitive resin layer 11 may be provided on the substrate 4, then patterning may be performed to form the first, second, third, and fourth patterns 10, 1, 9, and 2. Accordingly, the first, second, third, and fourth patterns 10, 1, 9, and 2 may have a substantially equivalent height from the substrate 4.

Figure 1B:
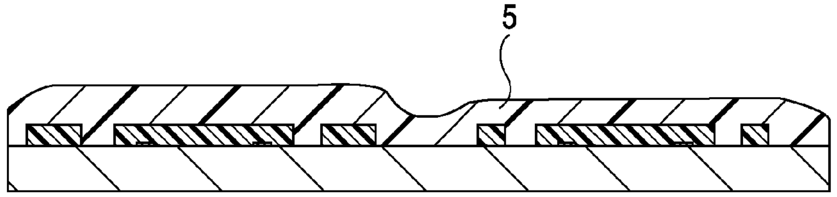

Then, referring to FIG. 1B, a cover layer 5 functioning as a discharge port forming member 14 is provided on the first, second, third, and fourth patterns 10, 1, 9, and 2 by coating. The method of coating may be spin coating, direct coating, slit coating, or the like. A solution with a solvent added may be used for coating. The cover layer 5 may contain negative photosensitive resin; however, it is not limited thereto. As described above, the third pattern 9 has a larger width in the Z direction than the width of the fourth pattern 2. Hence, a thickness of a part of the cover layer 5 on the first pattern 10 becomes larger than a thickness of another part of the cover layer 5 on the second pattern 1. This is possibly because a solid density in the vicinity of the first pattern 10 is different from a solid density in the vicinity of the second pattern 1.

Figure 1C:
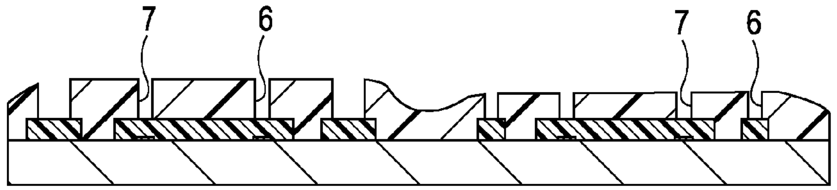

Then, referring to FIG. 1C, ink discharge ports 7 and through holes 6 are formed in the cover layer 5. The ink discharge ports 7 and the through holes 6 may be formed by exposing corresponding areas with UV or deep UV. After drying, the patterns are exposed to UV, and then developed.

Then, the first, second, third, and fourth patterns 10, 1, 9, and 2 are removed, so as to form passages 12 and grooves 13. Accordingly, the recording head illustrated in FIG. 1D can be obtained. Then, referring to FIG. 1D, the ink supply ports 8 are formed in the substrate 4. The ink supply ports 8 are formed by chemically etching the substrate 4. The substrate 4 employs a Si substrate, and the ink supply ports 8 are formed by anisotropic etching with a strong alkaline solution such as potassium hydroxide (KOH), sodium hydroxide (NaOH), or tetramethyl ammonium hydroxide (TMAH). In particular, the ink supply ports 8 are formed by etching the Si substrate with a crystal orientation of <100> with a TMAH solution for a dozen hours. Alternatively, the ink supply ports 8 may be formed before the first and second patterns 10 and 1 for the ink passages and the third and fourth patterns 9 and 2 for the base portions are formed (FIG. 1A), or before the ink discharge ports 7 are formed (FIG. 1B).

Figure 1D:
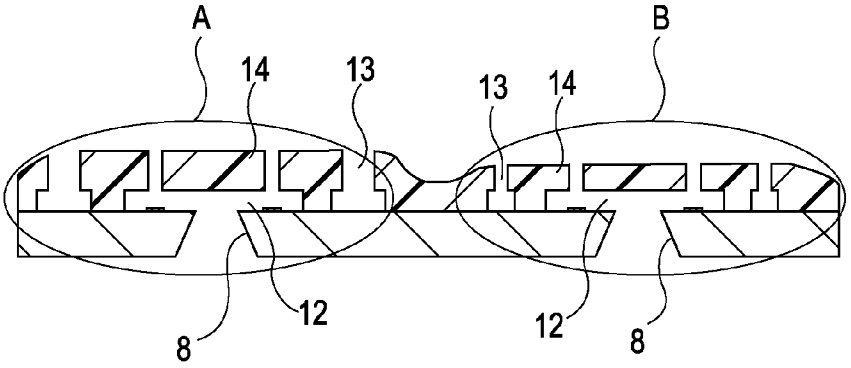

Comparing part A with part B in FIG. 1D, a thickness in part A of the discharge port forming member 14 for providing the discharge ports 7 is different from a thickness in part B thereof. Part A (relatively long discharge port) should be used for discharging black ink, whereas part B (relatively short discharge port) should be used for discharging other color ink. In addition, the grooves 13 are provided between adjacent passages 12. The grooves 13 can reduce a stress to be applied to the member forming the passages.

EXAMPLE

Example 1 is given below to describe the embodiment of the present invention more specifically.

Figure 3:
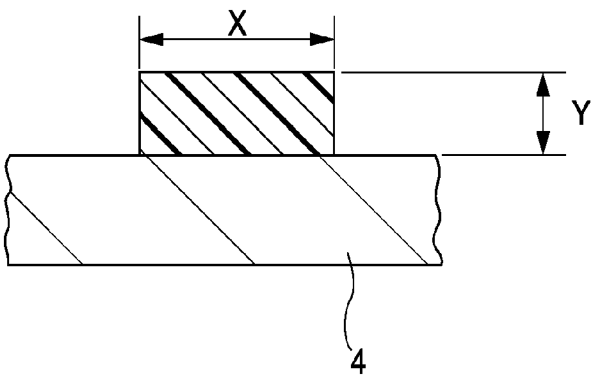
FIG. 3 is a schematic cross section showing a part of the inkjet recording head during manufacturing.

The recording head in FIG. 4 was manufactured according to the processes in FIGS. 1A to 1D. Herein, FIG. 3 is a cross section taken along the Z direction (FIG. 7). The cross section illustrates a height Y and a width X of the first, second, third, and fourth patterns 10, 1, 9, and 2.

Referring to FIG. 1A, the second pattern 1 and the first pattern 10 for the ink passages were formed with a dimension X of 100 μm and a dimension Y of 16 μm. In Example 1, the fourth pattern 2 and the third pattern 9 for the base portions were formed with different dimensions X. In particular, the dimension X of the third pattern 9 (base portion) was 50 μm, the dimension X of the fourth pattern 2 (base portion) was 20 μm, and the dimension Y of both patterns was 16 μm.

Then, the cover layer 5 was provided by spin coating on the dissoluble resin layer for the first, second, third, and fourth patterns 10, 1, 9, and 2 (for ink passages and base portions) as shown in FIG. 1B. At this time, resin for the cover layer 5 with a solid density of 50% was provided by a predetermined amount by spin coating, and processed by a number of rotations of about 1000 rpm. Accordingly, a distance between the generating element 3 and a discharge port plane in part A was 26 μm in average, and a distance between the generating element 3 and a discharge port plane in part B was 24 μm in average. Therefore, a structure was formed in which a difference in distances between the generating elements 3 and the discharge port planes in parts A and B was 2 μm in average.

Figure 2A:
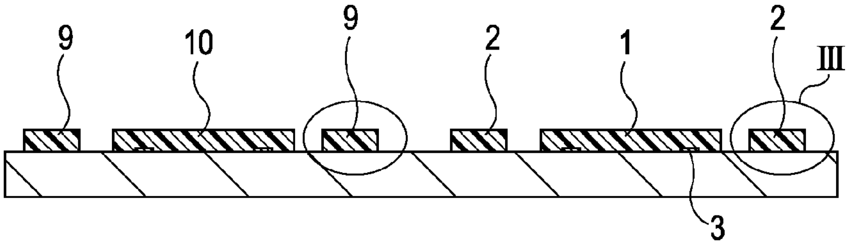
FIGS. 2A and 2B are schematic cross sections showing another example method of manufacturing an inkjet recording head.

Alternatively, as shown in FIG. 2A, the third pattern 9 and the fourth pattern 2 were formed to have equivalent dimensions X and equivalent dimensions Y (see FIG. 3 for sizes of the patterns shown in circled part III). Other processes were similar to those in Example 1, and the recording head was manufactured.

Figure 2B:
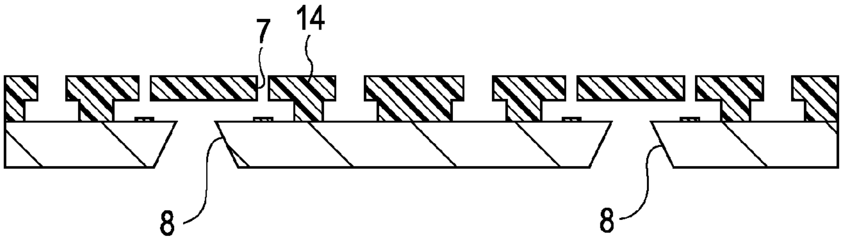

With these processes, as shown in FIG. 2B, the recording head with a constant thickness of the discharge port forming member 14 and a constant height of the discharge port plane was manufactured.

According to the above-described embodiment of the present invention, by varying the dimensions X of the third and fourth patterns 9 and 2 (base portions), the heights of the discharge port planes located above the ink passages surrounded by the third and fourth patterns 9 and 2 (base portions) can be varied in accordance with the dimensions X of the third and fourth patterns 9 and 2 (base portions). In Example 1, while the dimensions X (widths) of the third pattern 9 and the fourth pattern 2 were varied so as to vary the heights of the discharge port planes above the third and fourth patterns 9 and 2 (base portions), the heights of the discharge port planes may be varied by varying the dimensions Y (heights) of the third and fourth patterns 9 and 2. That is, the height of the discharge port planes may be varied in accordance with the shapes of the third and fourth patterns 2 and 9 (base portions). Alternatively, the heights of the discharge port planes may be varied by varying a distance between facing edges of the first and third patterns 10 and 9, and a distance between facing edges of the second and fourth patterns 1 and 2.

To form the third and fourth patterns 9 and 2 (base portions) shown in FIGS. 1A to 1D so as to have different heights, for example, the patterns 9 and 2 may be made of negative photosensitive resin, and a number of laminations of the negative photosensitive resin and a number of exposures may be varied between the patterns 9 and 2.

As described above, in the cover layer 5, the third and fourth patterns 9 and 2 (base portions) are made of the dissoluble resin layer with different shapes, widths, and heights, at different positions. Accordingly, the upper side of the second pattern 1 (ink passage) and the first pattern 10 (ink passage) can be formed flat. Further, the third and fourth patterns 9 and 2 (base portions) are made of the dissoluble resin layer with different shapes, widths, and heights, at different positions. Accordingly, a part of the cover layer 5 on the second pattern 1 (ink passage) and another part thereof on the first pattern 10 (ink passage) can be formed at different heights.

With the structure manufactured by this method, the distance between the generating element 3 and the discharge port plane can be easily varied depending on each passage, a corresponding ink supply port, or a color to be discharged. Accordingly, ink having different viscosities, or different kinds of ink may be used for the ink supply ports 8, thereby reliably discharging ink.

The generating element 3 is not limited to a heating resistor, and may be a piezoelectric element.

The embodiment of the present invention is effectively applicable to a type of recording head, in which an air bubble is generated by heating ink with a heating resistor, the air bubble is brought into communication with air, and accordingly, an extremely small ink droplet can be discharged. Since this type discharges an extremely small ink droplet of about 1 pico-liter, the height of the discharge port plane (distance between the generating element 3 and the discharge port plane) can be precisely controlled.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-174139 filed Jul. 2, 2007, which is hereby incorporated by reference herein in its entirety.

What is claimed is:

1. A method of manufacturing a liquid discharge head including a plurality of passages on a substrate, the passages communicating with a plurality of discharge ports configured to discharge liquid, the method comprising:

forming first, second, third, and fourth members, the first member having a shape of one passage, the second member having a shape of another passage, the third member being formed near the first member, the fourth member being formed near the second member, the first to fourth members being formed on a surface of the substrate such that longitudinal directions of the first to fourth members are arranged substantially in parallel to each other, and that a length of a part of the third member differs from a length of a part of the fourth member in a direction substantially orthogonal to the longitudinal directions thereof;

coating the substrate with a cover layer covering the first to fourth members; and removing the first member to form the one passage, and removing the second member form the another passage.

2. The method of manufacturing a liquid discharge head according to claim 1, wherein the third member is formed so as to sandwich a center line of the first member in the longitudinal direction thereof, and the fourth member is formed so as to sandwich a center line of the second member in the longitudinal direction thereof.

3. The method of manufacturing a liquid discharge head according to claim 1, wherein the third pattern surrounds the first pattern, and the fourth pattern surrounds the second pattern.

4. The method of manufacturing a liquid discharge head according to claim 1, wherein the length of the part of the third pattern is larger than the length of the part of the fourth pattern in the direction orthogonal to the longitudinal directions thereof, and a thickness of a part of the cover layer formed on the first pattern is larger than a thickness of another part of the cover layer formed on the second pattern.

5. The method of manufacturing a liquid discharge head according to claim 1, wherein the step of forming the first to fourth patterns includes patterning a layer of positive photosensitive resin formed on the substrate, thereby forming the first to fourth patterns.

6. The method of manufacturing a liquid discharge head according to claim 1, wherein the first to fourth patterns have a substantially equivalent height from the substrate.

7. The method of manufacturing a liquid discharge head according to claim 1, wherein the first and second patterns have a substantially equivalent length in the direction orthogonal to the longitudinal directions thereof.

8. The method of manufacturing a liquid discharge head according to claim 1, wherein the lengths of the third and fourth patterns in the direction orthogonal to the longitudinal directions thereof are substantially constant.

* * * * *